(12) United States Patent
Czubatyj et al.

(10) Patent No.: US 8,581,223 B2
(45) Date of Patent: Nov. 12, 2013

(54) MEMORY DEVICE AND METHOD OF MAKING SAME

(75) Inventors: Wolodymyr Czubatyj, Warren, MI (US); Tyler Lowrey, West Augusta, VA (US); Sergey Kostylev, Bloomfield Hills, MI (US)

(73) Assignee: Ovonyx, Inc., Sterling Heights, MI (US)

( * ) Notice: Subject to any disclaimer, the term of this patent is extended or adjusted under 35 U.S.C. 154(b) by 128 days.

(21) Appl. No.: 13/039,952

(22) Filed: Mar. 3, 2011

(65) Prior Publication Data

US 2011/0227027 A1 Sep. 22, 2011

Related U.S. Application Data

(60) Division of application No. 11/495,927, filed on Jul. 28, 2006, now Pat. No. 7,902,536, which is a continuation-in-part of application No. 10/799,265, filed on Mar. 12, 2004, now Pat. No. 7,407,829, which is a continuation of application No. 09/276,273, filed on Mar. 25, 1999, now Pat. No. 6,969,866.

(51) Int. Cl.
*H01L 47/00* (2006.01)

(52) U.S. Cl.
USPC ...... 257/4; 257/2; 257/3; 257/5; 257/E29.308

(58) Field of Classification Search
USPC .................................. 257/2, 3, 4, 5, E29.308
See application file for complete search history.

(56) References Cited

U.S. PATENT DOCUMENTS

| | | | |
|---|---|---|---|
| 4,809,044 A * | 2/1989 | Pryor et al. | 257/3 |
| 4,845,533 A * | 7/1989 | Pryor et al. | 257/4 |
| 5,177,567 A * | 1/1993 | Klersy et al. | 257/4 |
| 6,031,287 A * | 2/2000 | Harshfield | 257/734 |
| 2006/0043355 A1* | 3/2006 | Ryoo et al. | 257/2 |

* cited by examiner

*Primary Examiner* — Phat X Cao
(74) *Attorney, Agent, or Firm* — Honigman Miller Schwartz and Cohn LLP

(57) ABSTRACT

A radial memory device includes a phase-change material, a first electrode in electrical communication with the phase-change material, the first electrode having a substantially planar first area of electrical communication with the phase-change material. The radial memory device also includes a second electrode in electrical communication with the phase-change material, the second electrode having a second area of electrical communication with the phase-change material, the second area being laterally spacedly disposed from the first area and substantially circumscribing the first area.

Further, a method of making a memory device is disclosed. The steps include depositing a first electrode, depositing a first insulator, configuring the first insulator to define a first opening. The first opening provides for a generally planar first contact of the first electrode. The method further including the steps of depositing a phase-change material, depositing a second insulator, configuring the second insulator, depositing a second electrode having a second contact laterally displaced from said first contact, and configuring said second electrode.

40 Claims, 10 Drawing Sheets

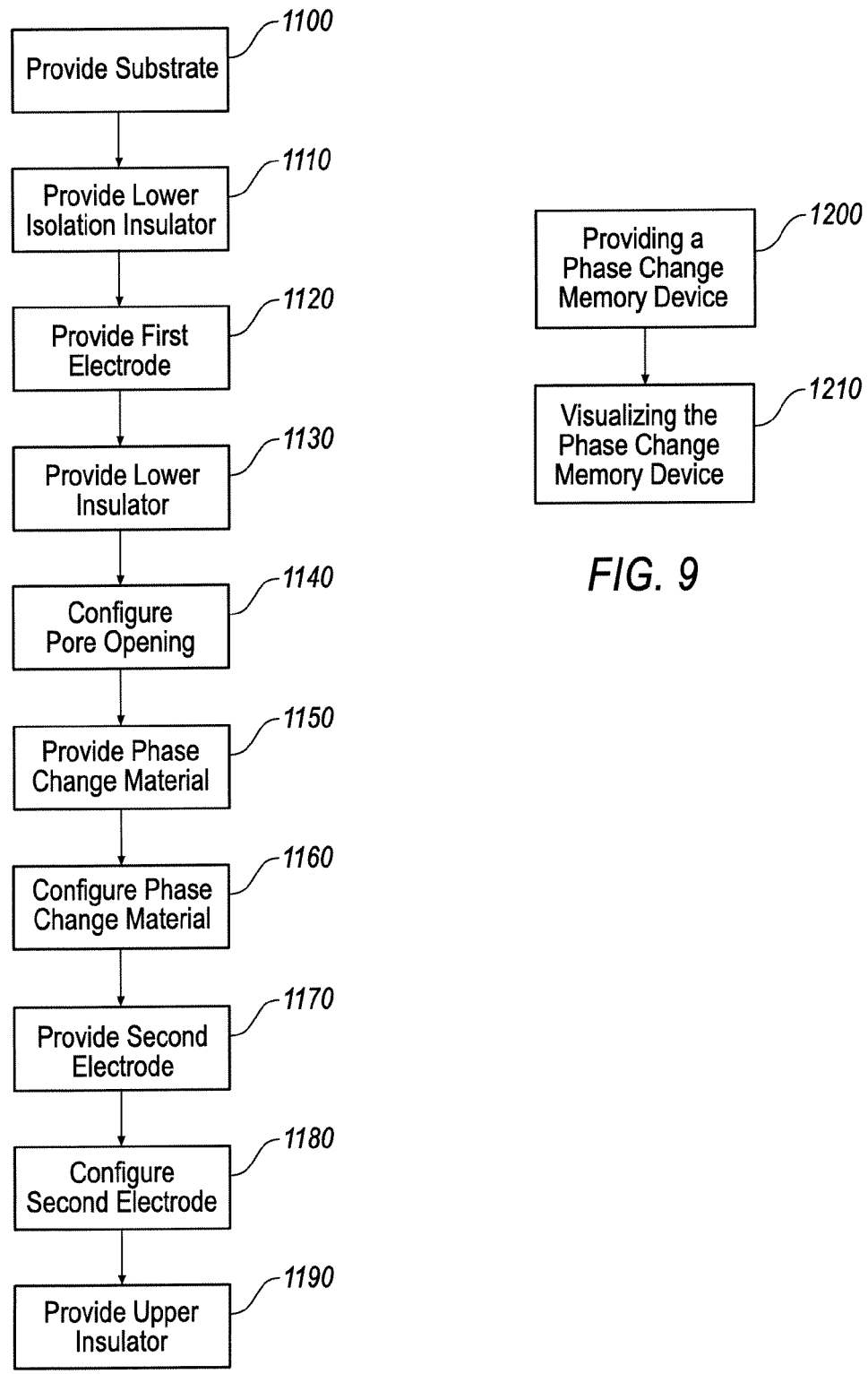

MEMORY DEVICE AND METHOD OF MAKING SAME

RELATED APPLICATIONS

The present application is a divisional patent application of U.S. application Ser. No. 11/495,927, titled "MEMORY DEVICE AND METHOD OF MAKING SAME," filed on Jul. 28, 2006, which is now issued as U.S. Pat. No. 7,902,536 on Mar. 8, 2011, which in turn was a continuation in part of U.S. application Ser. No. 10/799,265, titled "ELECTRICALLY PROGRAMMABLE MEMORY ELEMENT WITH IMPROVED CONTACTS," filed on Mar. 12, 2004, which is now issued as U.S. Pat. No. 7,407,829, which in turn claims priority to U.S. application Ser. No. 09/276,273, titled "ELECTRICALLY PROGRAMMABLE MEMORY ELEMENT WITH IMPROVED CONTACTS," filed on Mar. 25, 1999, which is now issued as U.S. Pat. No. 6,969,866, wherein the contents of the above mentioned applications are hereby incorporated by reference in their entirety.

TECHNICAL FIELD

The embodiments described herein are generally directed to devices including a phase-change material.

BACKGROUND

Non-volatile memory devices are used in certain applications where data must be retained when power is disconnected. Applications include general memory cards, consumer electronics (e.g., digital camera memory), automotive (e.g., electronic odometers), and industrial applications (e.g., electronic valve parameter storage). The non-volatile memories may use phase-change memory materials, i.e., materials that can be switched between a generally amorphous and a generally crystalline state, for electronic memory applications. The memory of such devices typically comprises an array of memory elements, each element defining a discrete memory location and having a volume of phase-change memory material associated with it. The structure of each memory element typically comprises a phase-change material, one or more electrodes, and one or more insulators.

One type of memory element originally developed by Energy Conversion Devices, Inc. utilizes a phase-change material that can be, in one application, switched between a structural state of generally amorphous and generally crystalline local order or between different detectable states of local order across the entire spectrum between completely amorphous and completely crystalline states. These different structured states have different values of resistivity, and therefore each state can be determined by electrical sensing. Typical materials suitable for such application include those utilizing various chalcogenide materials. Unlike certain known devices, these electrical memory devices typically do not use field-effect transistor devices as the memory storage element. Rather, they comprise, in the electrical context, a monolithic body of thin film chalcogenide material. As a result, very little area is required to store a bit of information, thereby providing for inherently high-density memory chips.

The state change materials are also non-volatile in that, when set in either a crystalline, semi-crystalline, amorphous, or semi-amorphous state representing a resistance value, that value is retained until reprogrammed as that value represents a physical state of the material (e.g., crystalline or amorphous). Further, reprogramming requires energy to be provided and dissipated in the device. Thus, phase-change memory materials represent a significant improvement in non-volatile memory technology.

However, current phase-change memory devices incur energy losses in the form of heat dissipation through adjacent and intrinsic structures, reducing the efficiency of the memory device. This means that current requirements for programming are higher than need be. when there is heat loss.

In addition to the aforementioned problems, the use of multi-level storage (representation of multiple bits within one physical memory cell) requires predictable and configurable programming characteristics that are not realized with some current devices. Further, current devices do not allow for direct imaging, measurement, or optical programming of the memory device structures that would allow for improved research and development, as well as novel new device design and product applications. Also, current devices are limited to memory applications.

Thus, a need has arisen to improve the efficiency of the memory device relating to the containment of heat resulting in reduction of necessary programming current. Additionally, it is desirable to reduce the number of process steps required to produce the memory device in order to increase yield.

Further, it is desirable to provide a memory device having improved controllability of programming for multi-level storage applications. A further need also exists to image, directly measure, and/or characterize the memory device during and after programming operations. It is also desirable to expand the range of uses for phase-change devices, as well as other novel optical devices.

SUMMARY

A radial memory device includes a phase-change material, a first electrode in electrical communication with the phase-change material, the first electrode having a substantially planar first area of electrical communication with the phase-change material. The radial memory device also includes a second electrode in electrical communication with the phase-change material, the second electrode having a second area of electrical communication with the phase-change material, the second area being laterally spacedly disposed from the first area and substantially circumscribing the first area.

Further, a method of making a memory device is disclosed. The steps include depositing a first electrode, depositing a first insulator, configuring the first insulator to define a first opening. The first opening provides for a generally planar first contact of the first electrode. The method further including the steps of depositing a phase-change material, depositing a second insulator, configuring the second insulator, depositing a second electrode having a second contact laterally displaced from said first contact, and configuring said second electrode.

BRIEF DESCRIPTION OF THE DRAWINGS

The features and inventive aspects will become more apparent upon reading the following detailed description, claims, and drawings, of which the following is a brief description:

FIG. 8 is a flow diagram of the construction of the alternative embodiment of FIGS. 3A-3D; and FIG. 9 is a flow diagram of the imaging of the embodiments of FIG. 6.

DETAILED DESCRIPTION

Figure 1A:
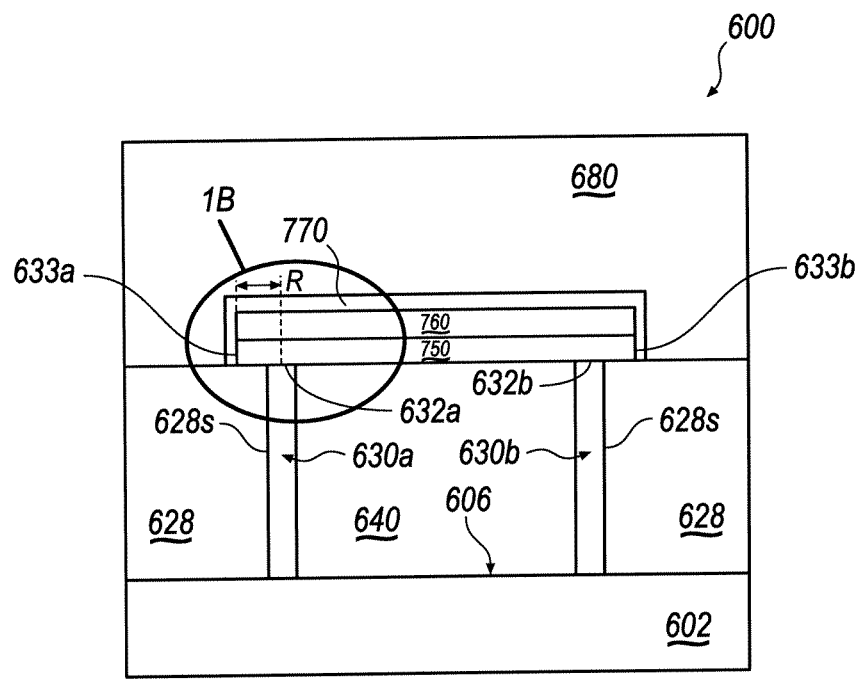
FIG. 1A is a cross-sectional view of a first embodiment of a radial memory device.

Referring now to the drawings, illustrative embodiments are shown in detail. Although the drawings represent the embodiments, the drawings are not necessarily to scale and certain features may be exaggerated to better illustrate and explain novel aspects of an embodiment. Further, the embodiments described herein are not intended to be exhaustive or otherwise limit or restrict the claims to the precise form and configuration shown in the drawings and disclosed in the following detailed description.

A radial memory device, including a phase-change memory material, is described in detail herein. The phase-change memory material is provided between two electrodes and is insulated from the surrounding structures. The phase-change memory material may be initially provided in a crystalline state allowing the phase-change memory material to be used as a virtual electrode and/or an interconnect path to read/write circuitry. The memory device may be written to and read in a manner described in U.S. Pat. No. 6,687,153, issued Feb. 3, 2004, to Lowrey, for "Programming a Phase-Change Material Memory", which is hereby incorporated by reference in its entirety. The radial memory device may be configured as an array of devices such that a high-density, non-volatile memory is created.

In yet another aspect, the radial memory device may be configured to provide multi-level storage. That is to say, the radial memory device may have a plurality of discrete and identifiable states allowing for multi-bit storage in a single memory element rather than a common binary storage element. The phase-change memory material may be configured, along with adjacent structures, to facilitate multi-level storage in an improved manner.

Additionally, an upper insulator may be provided in a transparent material thereby allowing for imaging of the phase-change memory material during or after programming and/or reading operations. The transparent upper insulator may also be configured to allow useful radiative emissions to exit the radial memory device and interface with an external target or device. Combinations of other materials may also be used for light emission, such as chalcogenide electrical switches and organic light emitting diodes (OLEDs). In addition, the transparent upper electrode also provides a window through which the device can also be programmed optically (i.e., the chalcogenide may be programmed by a light source, e.g., a laser, to an amorphous or crystalline state, or a state therebetween).

FIG. 1A is a cross-sectional view of a memory device 600 formed on a semiconductor substrate 602 according to a first embodiment. The memory device 600 comprises two independent single-cell memory elements. The first single-cell memory element comprises a first contact 630A (i.e., first electrode), memory material layer 750, and second contact 770. The second single-cell memory element comprises first contact 630B, memory material layer 750, and second contact 770 (i.e., second electrode). As shown in the embodiment shown in FIG. 1A, two memory elements may share a single continuous volume of phase change memory material. The insulative layer 760 provides for electrical isolation between the memory material 750 and the horizontally disposed section of the second contact 770. The insulative layer 760 also provides a thermal blanket keeping heat energy within the memory material layer 750. The dielectric region 640 electrically isolates the first contact 630A from the first contact 630B. The first contacts 630A,B and the second contact 770 supply an electrical signal to the memory material by way of contact regions 632A,B and 633A,B. As shown in FIG. 1A, memory device 600 includes two programmable regions. A first programmable region is defined by the portion of memory material 75—between contact regions 632a and 633a. A second programmable region is defined by the portion of memory material 750 between contact regions 632b and 633b. Although memory device 600 provides for more than one programmable regions, memory device 600 may be configured to provide only one programmable region with a single contact 630A (or alternatively contact 630B).

Upper dielectric region 680 is deposited on top of the memory device 600. Preferably, the upper dielectric layer 680 comprises borophosphosilicate glass (BPSG). First contacts 630A,B are conductive sidewall spacers (also referred to herein as "conductive spacers") formed along the sidewall surfaces 628S of the dielectric regions 628. (Sidewall surfaces 628S and surface 606 form a trench extending perpendicular to the plane of the illustration).

In the specific configuration depicted, the volume of memory material is a planar memory material layer 750 that is substantially horizontally disposed and positioned above the conductive sidewall spacers 630A,B so that the bottom surface of the memory layer 750 is adjacent to the top of each of the conductive spacers 630A,B (where "top" is defined relative to the substrate).

Preferably, the memory material is adjacent to an edge of the conductive sidewall spacer. In the embodiment shown in FIG. 1, the memory layer 750 is adjacent to the edges 632A,B of the conductive spacers 630A,B, respectively. In the embodiment shown, the edges 632A,B are lateral cross-sections of the conductive spacers 630A,B.

The area of contact between the memory material and the conductive spacers 630A,B is the area of contact between the memory material and the edges 632A,B. Hence, the only electrical coupling between the memory material and the conductive spacers 630A,B is through all or a portion of the edges 632A,B. The remainder of the conductive spacers 630A,B is electrically isolated from the memory material by dielectric regions 628 and 640. Contact region 633A does not overlap contact region 632A. Moreover, the areas of contact of memory material 750 are laterally displaced from one another. As shown in FIG. 1A, contact region 633A is laterally and radially displaced from contact region 632A. Contact region 632A is laterally displaced from contact region 633A by distance $d_L$. Thus, contact region 633A is laterally and spacedly disposed from conductive spacer 630A, and contact region 632A. Note that contact region 633A is not displaced spacedly vertically from contact region 632A but is also not overlapping. Moreover, the height of conductive spacer 630A is large compared to the width of conductive spacer 630A (alternatively, the width of conductive spacer 630A is narrow as compared to the height of conductive spacer 630A).

The memory elements of the embodiments may be electrically coupled to isolation/selections devices and to addressing lines in order to form a memory array. The isolation/addressing devices permit each discrete memory cell to be read and written to without interfering with information stored in adjacent or remote memory cells of the array. Generally, the embodiments presented are not limited to the use of any specific type of isolation/addressing device. Examples of isolation/addressing devices include field-effect transistors, bipolar junction transistors, and diodes. Examples of field-effect transistors include JFET and MOSFET. Examples of MOSFET include NMOS transistors and PMOS transistors. Furthermore NMOS and PMOS may even be formed on the same chip for CMOS technologies.

Figure 1B:
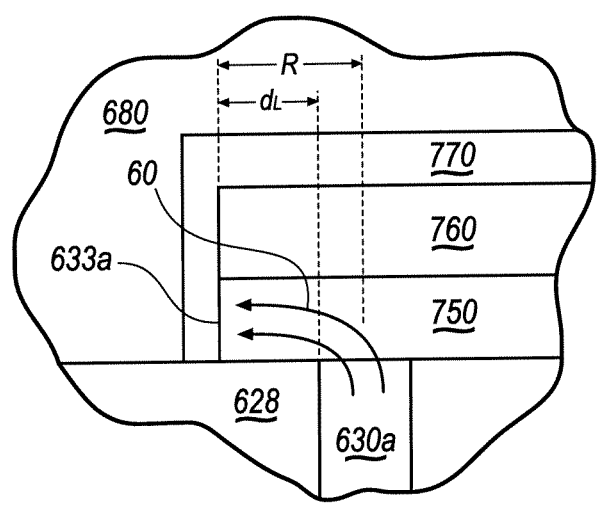
FIG. 1B is a cross-sectional view of current flow in the radial memo device of FIG. 1A.

FIG. 1B is an enlarged portion of FIG. 1A and shows current flow 60 through chalcogenide layer 750 from first contact 630A to second contact 770. Contact region 632A provides electrical communication between memory layer 750 and first contact 630A. Contact region 633A provides electrical communication between memory layer 750 and second contact 750. Current flow 60 is used to program, reset, and read the phase-change material (typically comprising a chalcogenide) of memory layer 750, as described below in detail.

In terms of operation as a radial device, memory device 600 includes a radius R between first contact 630A and second contact 770. Specifically, radius R represents a pathway through memory layer 750 that is between first contact 630A and second contact 770. Moreover, radius R illustrates the lateral and spaced displacement of contact regions 633A and 632A. As shown in FIG. 1A, the pathway is substantially parallel to semiconductor substrate 602. However, the orientation of memory device 600 relative to substrate 602 does not necessitate radius R as being perfectly planar or as oriented with respect to semiconductor substrate 602. Further, as shown in FIG. 1B, current flow 60 moves through memory layer 750 in a manner that is radial with respect to first contact 630A and second contact 770. Contact region 633A is laterally and spacedly displaced from first contact 630A. In such a configuration, memory material 750 acts as an insulator for current flowing through a virtual electrode (explained below in detail with respect to FIGS. 3A-3C).

It is noted that in the embodiment shown in FIG. 1B, the contact region 633A is vertically disposed from contact region 632A. In the embodiment shown, the contact region 633A is above contact region 632A.

Figure 2A:
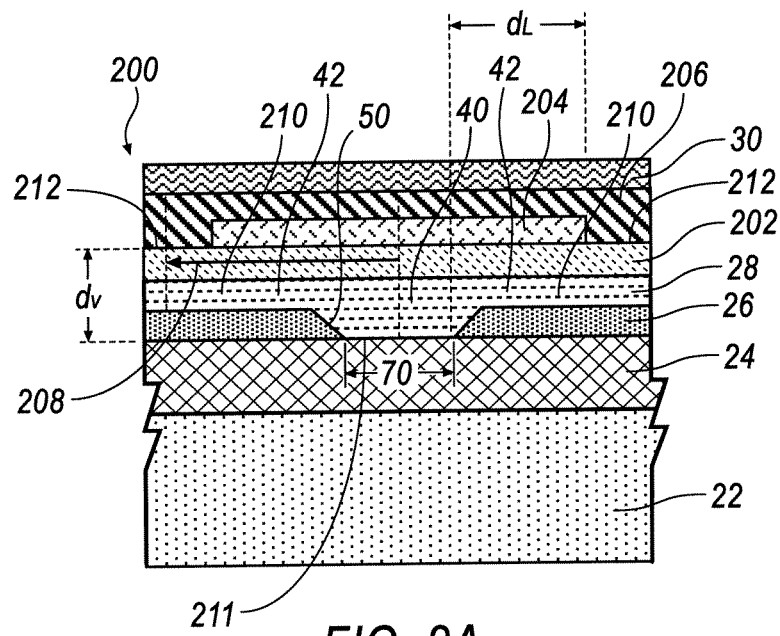
FIG. 2A is a cross-sectional view of a radial memory device according to an alternative second embodiment.

FIG. 2A illustrates an alternative second embodiment of a radial memory device 200 including an optional carbon layer 202, a top insulator 204 and a second electrode 206. The general structure consists of lower isolation layer 22, a first electrode 24, lower insulator 26, phase-change layer 28, an upper insulator 30, pore region 40, and a sloped portion 50. Generally, optional carbon layer 202 is provided as an etch stop. In one embodiment, the carbon layer 202 may have a thickness of less than about 100 Angstroms. In another embodiment, the carbon layer 202 may have a thickness between about 30 Angstroms and about 100 Angstroms. In another embodiment, the carbon layer 202 may have a thickness of less than about 50 Angstroms. In another embodiment, the carbon layer 202 may have a thickness between about 30 Angstroms and about 50 Angstroms. In another embodiment, the carbon layer 202 may have a thickness of less than about 40 Angstroms. First contact region 211 is laterally and spacedly displaced from second contact region 212 by a distance $d_L$. Moreover, first contact region 211 is vertically and spacedly displaced from second contact region 212 by a distance $d_V$.

A first region of contact 211 is between first electrode 24 and phase-change layer 28 where there is electrical communication therebetween. A second region of contact 212 is between second electrode 206 and optional carbon layer 202 which in turn contacts phase-change layer 28. The optional carbon layer 202 is very thin such that there is substantially no lateral current flow therein. Thus, current flows from phase-change layer 28 substantially vertically through optional carbon layer 202 to second region of contact 212. Optional carbon layer 202 acts as an etch stop in the manufacturing process such that when insulator 204 is configured, phase-change layer 28 is not etched (generally because phase-change layer 28 etches at a higher rate than the insulative material).

In one embodiment of the invention, the carbon layer 202 has a lateral resistance which is sufficiently high so that there is substantially no lateral current flow through the carbon layer. In one embodiment, the lateral resistance of the carbon layer 202 may be at least ten times greater than the lateral resistance of the crystallized phase change region which forms the virtual upper electrode. In another embodiment, the lateral resistance of the carbon layer 202 may be at least 100 times greater than the lateral resistance of the virtual upper electrode.

In operation, current flows from electrode 24, through pore opening 70, and through pore region 40. From pore region 40, the current flows to the crystallized phase change region which forms a virtual upper electrode. The current flows laterally through the phase-change virtual electrode and then (if present) through the portion of carbon layer 202 which is directly below the second electrode 206 and then into the second electrode 206. Top insulator 204 is provided to electrically and thermally insulate phase-change layer 28, as well as carbon layer 202, from second electrode 206 except at some radial distance 208 from the pore.

In the embodiment shown in FIG. 2A, the contact region 212 does not overlap the contact region 211. Moreover, contact region 212 is laterally spaced from contact region 211 by a lateral distance $d_L$. In addition, contact region 212 is vertically spaced from contact region 211 by a vertical distance $d_V$. In one embodiment, $d_L$ may be greater than $d_V$. In another embodiment, $d_L$ may be at least twice as great than $d_V$.

In the embodiment of the invention shown in FIG. 2A, the footprint (e.g., the projection onto a horizontal plane) of the contact region 212 completely circumscribes the footprint of the contact region 211. In addition, the footprint of contact region 212 forms an annulus. In this case, the lateral displacement $d_L$ is the same all the way around the contact region 211.

Radial distance 208 illustrates the lateral and spaced displacement between first contract region 211 and second contact region 212. Thus, top insulator 204 and contact region 212, being situated radially outward from pore opening 70, force current through outer regions 210 of phase-change layer 28 before passing through optional carbon layer 202 and ultimately contacting region 212.

Figure 2B:
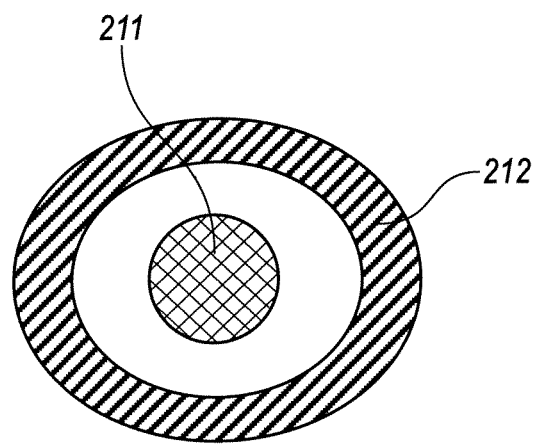
FIG. 2B is a plan-view of a radial memory device of FIG. 2A showing the second contact region surrounding the first contact region.

FIG. 2B is a plan view of the embodiment of FIG. 2A. Second contact region 212 substantially circumferentially surrounds first contact region 211. FIG. 2B essentially shown a projection of first contact region 211 and second contact region 212 on a plane considered a footprint. Although it is not necessary to configured second contact region 212 to entirely surrounds first contact region 211, it is preferred at least for evenness of current flow through phase change layer 28 as well as pore opening 70. In some embodiments, however, second contact region 212 may be "C" shaped or have a gap creating as substantially surrounding second contact region 212.

Insulator 204 in on top of phase-change layer 28 and optional carbon layer 202, and covers pore opening 70 such that some radial distance is required to be traversed by current flow 60 through phase-change layer 28 between pore opening 70 and contact region 212 of second electrode 206.

Figure 2C:
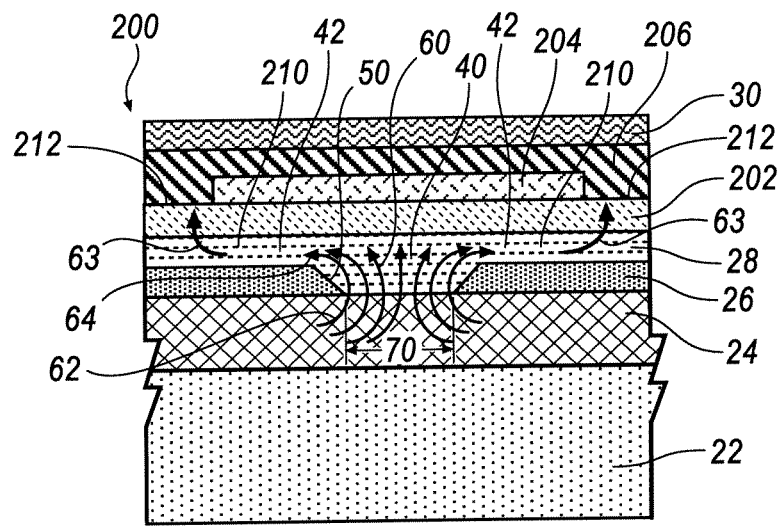
FIG. 2C is a cross-sectional view of current flow through the radial memory device of FIG. 2A.

FIG. 2C is a cross sectional view showing current flow through pore opening 70 and out to the radially disposed contact region 212 of second electrode 206. Current flow 60 is shown as lower contact current flow 62, within first electrode 24, and phase change current flow 64, within phase-change layer 28. Further, lateral current flow 63 is shown where the lateral resistance of phase-change layer 28 is lower than the lateral resistance of optional carbon layer 202 and lower insulator 26. Thus, current flows substantially through phase-change layer 28. Near second contact region 212, lateral current flow 63 turns from a lateral flow and travels through optional carbon layer 202 to second contact region 212 to second electrode 206. Although the lateral resistance of optional carbon layer 202 is higher than the lateral resistance of phase-change layer 28, current 63 will travel substantially vertically through optional carbon layer 202 to second contract region 212.

It is noted, that in another embodiment of the invention, the pore opening 70 may instead be formed as any other type of opening. Hence, the opening may be formed as a hole (of any shape) as well as a trench. If the opening is a trench, then the second contact region 212 would be two separate regions.

Figure 2D:
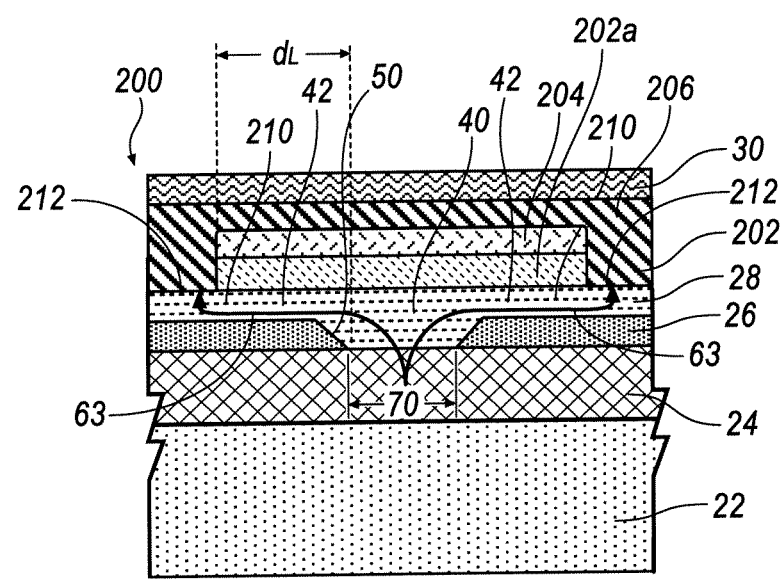
FIG. 2D is a cross-sectional view of current flow through the radial memory device where the second electrode directly contacts the phase change material.

FIG. 2D is a cross-sectional view of current flow through radial memory device 200 where second electrode 206 directly contacts phase-change layer 28 at second contact region 212. In this embodiment, rather than leaving etch stop layer 202A, a process step is added to configure etch stop layer 202A such that it only remains under insulator 204. Thus, when second electrode 206 is deposited, the electrode will directly contact the phase-change layer 28 at second contact region 212. Lateral current flow 63 is shown where the lateral resistance of phase-change layer 28 is lower than the lateral resistance of etch stop layer 202A and lower insulator 26. Thus, current flows substantially through phase-change layer 28. Near second contact region 212, lateral current flow 63 turns from a lateral direction and travels directly to second contact region 212.

Figure 3A:
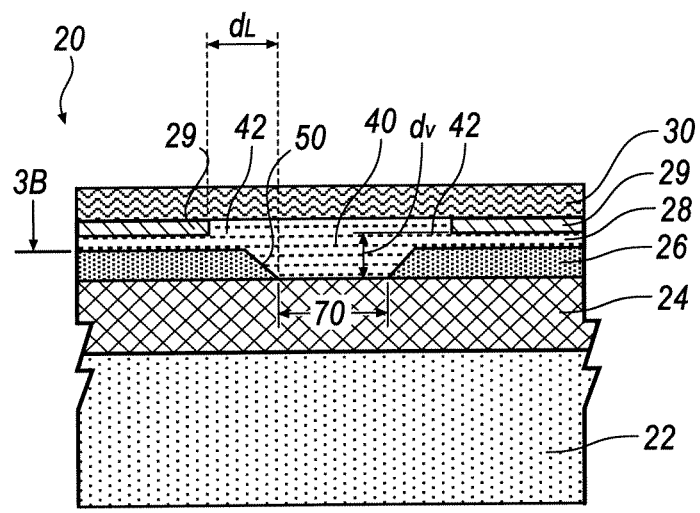
FIG. 3A is a cross-sectional view of a radial memory device according to an alternative third embodiment.
Figure 3B:
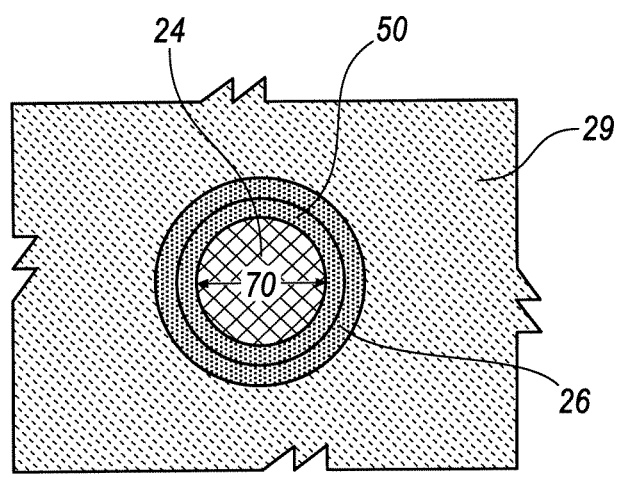
FIG. 3B is a top plan-view of a lower insulator and an electrode of the radial memory device of FIG. 3A.
Figure 3C:
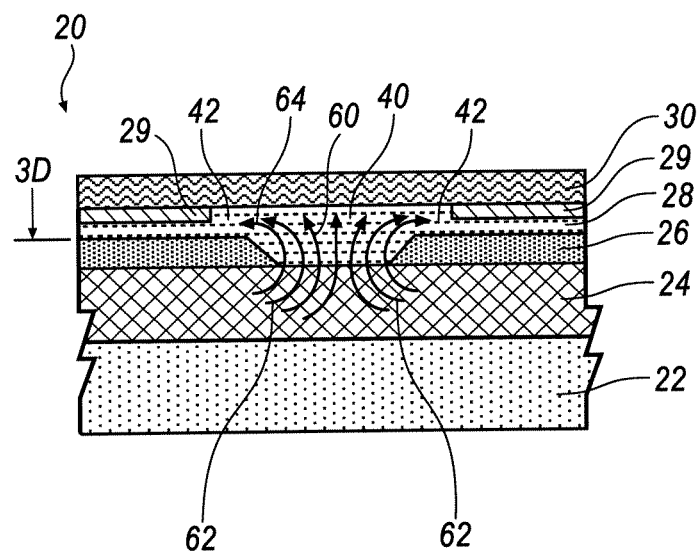
FIG. 3C is a cross-sectional view of current flow through the radial memory device of FIG. 3A.

Referring now to FIGS. 3A-3C, an alternative third embodiment of a radial memory device 20 is illustrated. Radial memory device 20 includes a lower isolation layer 22, first electrode 24, a lower insulator 26, a phase-change layer 28, an second electrode 29 and an upper insulator 30. Phase-change layer 28 further comprises a pore region 40 and a virtual electrode 42. Lower insulator 26 further includes a sloped portion 50. Lower isolation layer 22 generally isolates radial memory device 20 from underlying structures on the substrate. Specifically, lower isolation layer 22 electrically and thermally isolates first electrode 24 and pore region 40, as leakage of heat or current reduces the performance of radial memory device 20. First electrode 24 is a conductive material and is connected to external circuitry (not shown) for reading and writing operation of radial memory device 20. Lower insulator 26 is provided to electrically and thermally insulate first electrode 24 from phase-change layer 28 and is used to define pore region 40 which confines the current (explained below in detail with respect to FIGS. 3C and 3D).

Phase-change layer 28 is provided as a layer of phase-change memory material such as chalcogenide and is in electrical communication with first electrode 24 by way of a pore opening 70 through lower insulator 26. Phase-change layer 28 is most preferred a $Ge_2Sb_2Te_5$ chalcogenide alloy (hereinafter referred to as GST225). As used herein, the term phase-change memory material refers to a material capable of changing between two or more phases that have distinct electrical characteristics. Phase-change layer 28 preferably includes at least one chalcogen element selected from Te and Se, and may further include one element selected from the group consisting of Ge, Sb, Bi, Pb, Sn, As, S, Si, P, O, N, In and mixtures thereof. Suitable phase-change materials include, but are not limited to, GaSb, InSb, InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb(SeTe), and $Te_{81}Ge_{15}Sb_2S_2$.

The resistivity of chalcogenides generally varies by two or more orders of magnitude when the chalcogenide material changes phase from an amorphous state (more resistive) to a polycrystalline state (less resistive). In memory devices such as those incorporating radial memory devices such as described by FIGS. 1A, 2A, and 3A, electrodes deliver an electric current to the phase-change memory material. As the electric current passes through pore region 40, at least a portion of the electric energy of the electrons is transferred to the surrounding material as heat. That is, the electrical energy is converted to heat energy via Joule heating. The amount of electrical energy converted to heat energy increases with the resistivity of the electrical contact (and memory material) as well as with the current density (i.e., current divided by area) passing through the electrical contact and the memory material.

As illustrated in FIGS. 3A and 3B, lower insulator 26 is provided as a layer wherein pore opening 70 is a generally circular hole having a tapered inner edge represented by sloped portion 50 and exposing first electrode 24. When phase-change layer 28 is provided, typically through a deposition process, phase-change layer 28 covers lower insulator 26 and fills pore opening 70. Pore region 40 is in electrical communication with first electrode 24 provided by pore opening 70 through lower insulator 26. Further, pore region 40 is inherently in electrical communication with virtual electrode 42 because pore region 40 and virtual electrode 42 are regions of the same phase-change layer 28. Indeed, virtual electrode 42 is a portion of phase-change layer 28 that connects to an second electrode 29. Virtual electrode 42 provides a conductive path from pore region 40 to second electrode 29. Additionally, the function of virtual electrode 29 may be tuned in that an aspect ratio defined by the thickness of phase-change layer 28 as well as the distance 23. As distance 23 increases, phase change current flow 64 must travel farther. Additionally, where the thickness of phase-change layer 28 is substantially less than distance 23, current crowding will increase. Alternatively, where the thickness of phase-change layer 28 is substantially greater than distance 23, current crowding through phase-change layer 28 will reduce.

Second electrode 29 is preferably metal and is patterned such that second electrode 29 is not present above pore region 40 (i.e., second electrode 29 is configured to have a circular opening above pore region 40). Moreover, second electrode 29 is laterally and spacedly displaced a distance 23 from pore opening 70. Additionally, second electrode 29, while being in electrical communication with phase-change layer 28, is further connected to external circuits for the programming and reading of pore region.

Because radial memory device 20 is typically constructed between various layers of an integrated circuit, the insulative structures are provided for isolation of radial memory device 20. Electrical isolation is provided for the efficient operation of radial memory device 20 and so electric current leakage is reduced that may interact with adjacent circuitry or other radial memory devices 20. Thermal isolation is provided so that device operating heat is concentrated in pore region 40. Upper insulator 30 is provided for thermally and electrically insulating second electrode 29 and phase-change layer 28 from adjacent circuits and structures (not shown). Similarly, lower isolation layer 22 provides thermal and electrical insulation of first electrode 24 and pore region 40 from adjacent structures. Within radial memory device 20, lower insulator 26 provides thermal and electrical insulation to phase-change layer 28 from first electrode 24 except at pore opening 70, which defines the active region of the device.

Lower isolation layer 22 and upper insulator 30 generally allow radial memory device 20 to be located adjacent to semiconductor regions or back metallization and/or interconnect layers. Such an arrangement facilitates the placement of radial memory device 20 within the strata of any type of mass-produced layered devices.

Turning now to FIGS. 3A-3D, the operation of radial memory device 20 is described in detail. First electrode 24 and second electrode 29 are connected to support circuitry (not shown) for programming (writing information) and reading radial memory device 20. The support circuitry may include the capability to program and read radial memory device 20 in binary mode which provides two states as well as a multi-level mode providing a variable number of states.

When combined with support circuitry, first electrode 24 is provided with an electrode source current 62. As described above with respect to FIGS. 3A and 3B, insulators 22, 26, 30 prevent leakage directly from first electrode 24 to second electrode 29 or to surrounding structures. When electrode source current 62 is provided, an electrical circuit path is formed from first electrode 24 through pore region 40 and virtual electrode 42 to second electrode 29. Due to pore opening 70 being narrow in comparison with the overall size of radial memory device 20, current crowding 60, increased current density (current per unit area), occurs first at pore opening 70, i.e., current crowding 60 is provided at pore opening 70 and flows through pore region 40 to virtual electrode 42. The current then flows through virtual electrode 42 with a reduced current density because the current is spread outwardly through virtual electrode 42 to the radially surrounding second electrode 29 (illustrated in FIG. 3B).

Due to the physical configuration of pore region 40, current crowding 60 provides heating of pore region 40 through joule heating without substantially heating virtual electrode 42 due to reduced current density through virtual electrode 42. Such heating provides the changes in state of pore region 40 of phase-change layer 28 without substantially changing the phase of virtual electrode 42. In the case of thermal insulation, insulators 22, 26, 30 provide that heat held by pore region 40 is efficiently concentrated at pore region 40 and is transferred minimally to surrounding circuitry or portions of first electrode 24 that are not in contact with pore region 40. Further, virtual electrode 42 serves as a thermal insulator around pore region 40 because the crystalline phase-change material is thermally resistive.

Figure 3D:
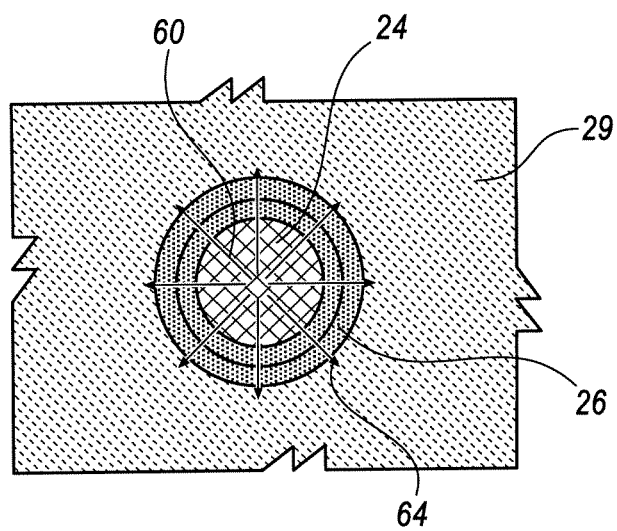
FIG. 3D is a top plan-view of current flow through the radial memory device of FIG. 3A.

FIG. 3D show current crowding 60 and a current density dissipation into virtual electrode 42 (see FIG. 3C) and an second electrode 29. After current crowding 60 is forced to occur through narrow pore opening 70, the surrounding virtual electrode 42 provides a significantly greater cross-sectional area for current to flow. Thus, while crowding occurs in pore region 40, a significantly reduced current density flows through virtual electrode 42. In this way, current density is significantly increased through pore region 40 as compared to first electrode 24, virtual electrode 42, and second electrode 29.

During read operations, the current may be at a low level that is used for detecting the resistivity of pore region 40. That is, the resistivity of pore region 40 is sensed without using a significant current that could heat pore region 40. During a write operation, the current may be a high current that programs pore region 40 to a particular memory state. In the case of multi-level storage, sloped portion 50 of lower insulator 26 provides improved controllability of the heating and cooling phases of pore region 40 (described in detail with respect to FIGS. 4A-4D).

The programming and reading of radial memory device 20 is now described in detail in U.S. Pat. No. 6,570,784, issued May 27, 2003, to Lowrey, for "Programming a phase-change material memory", which is hereby incorporated by reference in its entirety. In general, pore region 40 is provided with a first pulse of current to leave the material in a first state where pore region 40 is generally amorphous and has high resistivity characteristics. The first pulse has a generally rectangular shape allowing rapid heating and rapid cooling of pore region 40. In changing phase to a generally crystalline state, pore region 40 is provided with a second pulse of current having a generally triangular shape. Thus, pore region 40 is heated and cooled more slowly than the first pulse because of the shape of the second pulse (i.e., the gradual drop in current provides a slower cooling than a sharp drop in current). The slower cooling provides a more crystalline formation of phase-change layer 28, and thus reduced resistivity therethrough.

Figure 4A:
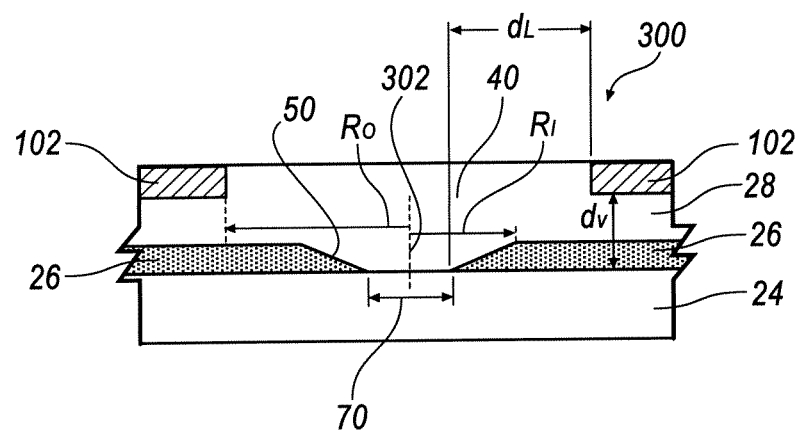
FIG. 4A is a cross-sectional view of a sloped region of the lower insulator that may be applied to the embodiments of FIGS. 2A-2C and 3A-3D.
Figure 4B:
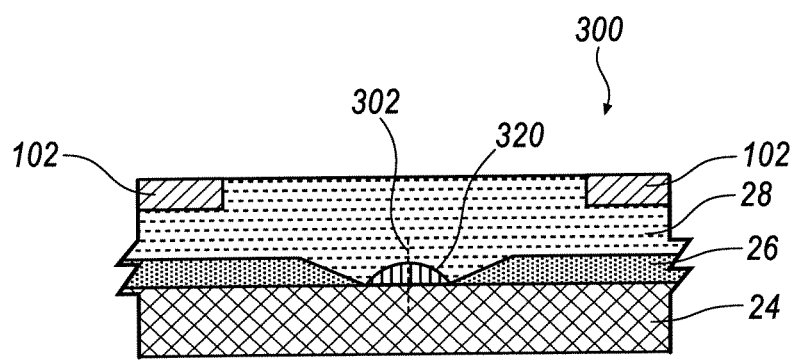
FIGS. 4B-4D are cross-sectional views illustrating the programming of the embodiments of FIG. 4A.
Figure 4C:
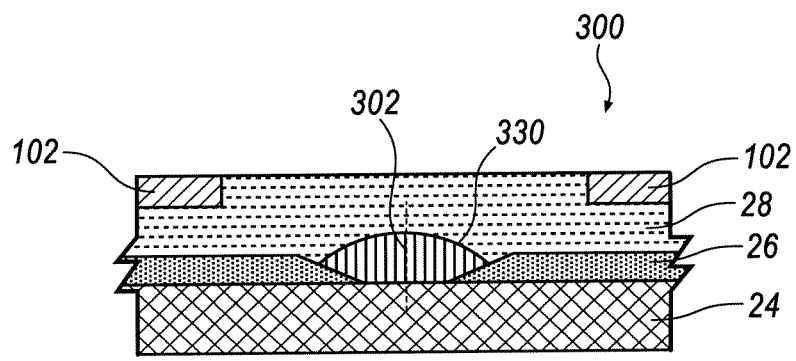

FIG. 4A illustrates in detail sloped portion 50 of lower insulator 26. The angled nature of sloped portion 50 allows for improved deposition of phase-change layer 28 when a radial memory device is made (explained in detail below with respect to FIGS. 7 and 8). As shown in FIGS. 4A-4C, radial memory device 300 is shown without additional layers above an second electrode 102 allowing the principles discussed with respect to FIGS. 4A-4D to be applied to the embodiments shown in FIGS. 1A-1B, 2A-2C, and 3A-3D, even though the individual configurations of the upper layers may differ.

Second electrode 102 is laterally and spacedly displaced from pore region 70 by distance $d_L$. Moreover, second electrode 102 is vertically and spacedly displaced from pore region 70 by a distance $d_V$. A radius $R_O$ extends from the center of pore opening 70 to second electrode 102 and such radius is used to determine the pure radial device resistance, discussed in detail below.

Inner radius $R_I$ extends from a center 302 of pore opening 70 to the top of sloped region 50. Thus, the radius of pore opening 70 and inner radius $R_I$ essentially defines the slope and size of sloped region 50. Outer radius $R_O$ extends from center 302 of pore opening 70 to an inner edge of second electrode 102 (and generally extends beyond sloped portion 50). As illustrated by FIG. 4A, outer radius $R_O$ is greater in length than inner radius $R_I$. The geometry of sloped portion 50 is defined by inner radius $R_I$ and the wall slope of sloped portion 50. As a result, because phase-change layer 28 is provided in manufacture after lower insulator 26 (explained below in detail with respect to FIGS. 7 and 8), the geometry of pore region 40 is defined at least in part by the geometry of sloped portion 50, and to some extent outer radius $R_O$.

Device resistance for concentric rings of pore region 40 for embodiments including either a vertical edge 404 (see FIGS. 5A and 5B) or sloped portion 50 (see FIG. 2A), based on outer radius Ro and inner radius $R_I$, are calculated to determined the radial device resistance of radial memory device 20 using the following formula:

$$R = \frac{\text{Ln}\left(\frac{R_O}{R_I}\right)}{2\pi * \text{Sigma} * \text{Thickness}}$$

Table 1 includes the necessary constants for the present embodiment for calculating pure radial device resistance.

TABLE 1

|  | Crystalline GST225 | Amorphous GST225 |
|---|---|---|
| Ro | 8μ (8.00E−06 m) | 8μ (8.00E−06 m) |
| $R_I$ | 0.25μ (2.5E−07 m) | 0.25μ (2.5E−07 m) |
| Sigma | 100 (ohm * cm) − 1 | 0.001 |
| Thickness | 500 Å (5.00E−08 m) | 500 Å (5.00E−08 m) |

Table 2 provides the pure radial results for device resistance calculated from the equation above and Table 1.

TABLE 2

|  | Crystalline GST225 | Amorphous GST225 |
|---|---|---|
| Resistance (R) | 1.10E+03 Ω | 1.10E+08 Ω |

Table 2 illustrates that phase-change layer 28, in this embodiment GST225, exhibits a pure radial device resistance of around 1.0 E+03 ohms when fully crystallized. In an amorphous state, phase-change layer 28 has a pure radial device resistance that is around 1.0 E+08 ohms. Because $R_I$ represents the minimum area of pore region 40, the maximum current crowding will occur in the interface of pore region 40 at pore opening 70 adjacent to first electrode 24. A fully crystallized pore region 40 is shown in FIG. 4B. When current is provided above the reset threshold, pore region 40 will have a first reset volume 320 at pore opening 70 as illustrated in FIG. 4C. As increased current is provided, pore region 40 will have a greater volume of phase-change material reset at a second reset volume 330.

Figure 4D:
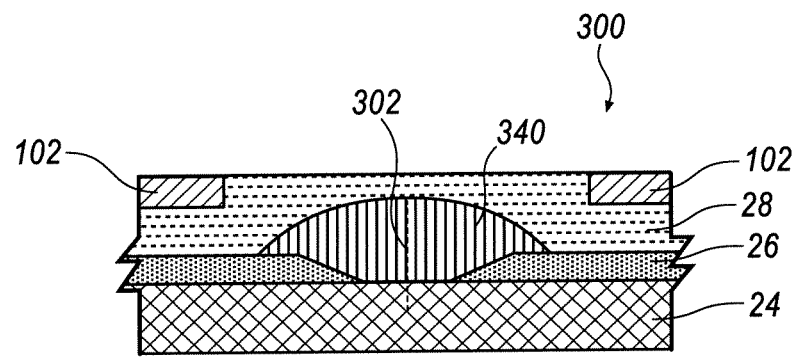

Increased volumes of reset phase-change material are illustrated in FIGS. 4D and 4E by second volume 330 and a third reset volume 340. After third reset volume 340, generally defined by $R_O$, self-limiting reset starts to occur because of the current spreading in radial memory device 300. The self-limiting function is controlled by a number of factors including the phase-change material provided, the time and magnitude of current provided, the efficiency of insulators 22, 26, 30, and the dimensions $R_I$, $R_O$ of sloped portion 50. When focusing on the geometry of sloped portion 50, current crowding is reduced as the radius of the pore opening increases from $R_I$ to $R_O$. This is because the current travels through an increased area as $R_O$ is approached.

The reduced current crowding defines the self limiting nature of pore region 40 because at a critical point the density of current crowding is not enough to cause the reset of the phase-change material (illustrated in FIG. 4E as fourth reset volume 340). The cross-sectional area of pore region 40 increases moving from $R_I$ to $R_O$. Thus, the device resistance also increases moving from $R_I$ to $R_O$, and thus, more current is required to heat pore region 40. Because the current requirements increase from first reset volume 310 to fourth reset volume 340, the reset function is limited due to the nature of pore region 40 and sloped portion 50 providing an increased device resistance moving to $R_O$.

As illustrated, there is a progression of reset volumes 310, 320, 330, 340. This progression becomes advantageous for a multi-level storage device. Where time and/or current magnitude are adjustable, pore region 40 may be selectively reset to volumes 310, 320, 330, 340. Indeed, sloped portion 50 provides a gradual reset of pore region 40. Thus, the configuration of lower insulator 26, including sloped portion 50, has clear advantages for multi-state memory devices. Further, sloped portion 50 provides controlled thinning of phase-change layer 28. As illustrated, radial memory device 300 has a minimum of four (4) discrete states. However, in practice radial memory device 300 includes a plurality of states bounded by the resolution of programming and reading pore region 40. Thus, FIGS. 4B-4E illustrate multi-level programming of radial memory device 300 and are shown without certain elements of embodiments described herein because the programming function is not intrinsically tied to a specific embodiment (i.e., multi-level programming may be applied to all embodiments described herein).

Figure 5A:
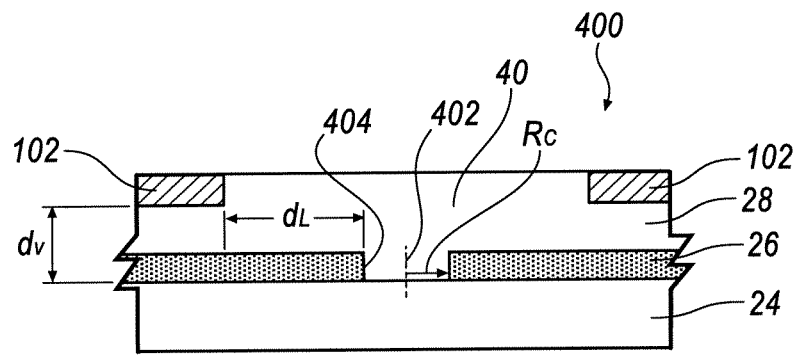
FIG. 5A is a cross-sectional view of an alternative fourth embodiment of a lower insulator that may be applied to the embodiments of FIGS. 1A-1B, 2A-2C, 3A-3D, and 4A-4D.

In contrast, FIG. 5A illustrates a memory device 400 as a fourth alternative embodiment, including lower insulator 26, that includes a vertical edge 404 rather than sloped portion 50 of the embodiments of FIGS. 2, 3, 4, and 6. However, because vertical edge 404 only provides a constant radius $R_C$, the current density through pore opening 70 is constant. Thus, the gradual reset characteristic provided by sloped portion 50 is reduced by the structural configuration of radial memory device 400. However, all of the radial memory devices described herein may utilize vertical edge 404 (i.e., $R_C$ is constant) rather than sloped portion 50 (discussed above in detail with respect to FIG. 4A). The interface of first electrode 24 to phase-change layer 28 is laterally and spacedly displaced from second electrode 102 by a distance $d_L$. Moreover, the interface of first electrode 24 to phase-change layer 28 is vertically and spacedly displaced from second electrode 102 by a distance $d_V$.

Figure 5B:
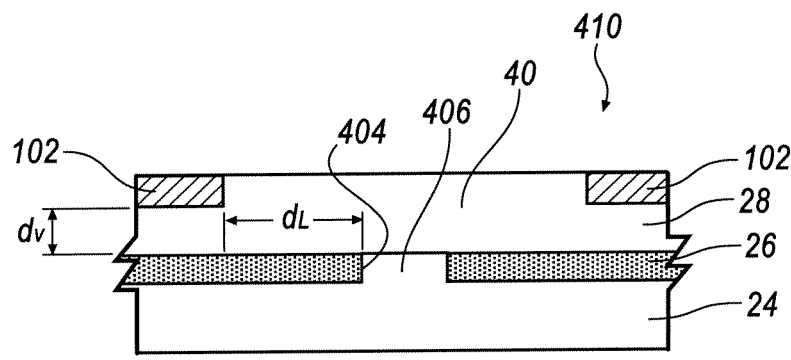
FIG. 5B is a cross-sectional view of an alternative embodiment of FIG. 5A.

FIG. 5B illustrates and alternative embodiment of FIG. 5A of a memory device 410 wherein bottom electrode 24 protrudes upward. Bottom electrode 24 is then in contact with vertical edge 404 and then contacts phase-change layer 28 along a place defined by lower insulator 26 at a bottom contact 406. As shown in the drawings, bottom electrode 24 protrudes through a hole in lower insulator 26 and is vertically and spacedly displaced from second electrode 102 by a distance $d_V$.

Figure 6:
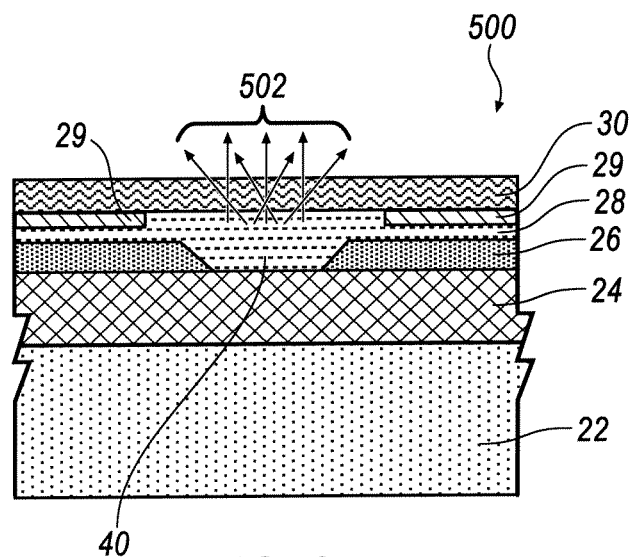
FIG. 6 is a cross-sectional view of an alternative fifth embodiment having a transparent upper insulator and emissive radiation from a pore region.

FIG. 6 illustrates a fifth alternative embodiment having an emissive radiation 502 from pore region 40 exiting radial device 500 through transparent upper insulator 30. Because of the resistance of pore region 40, emissive radiation 502 is generated by the dissipation of power through the joule heating that is not lost to heat. When used as a memory device, radial memory device 20 is configured to dissipate power preferably in the form of heat. However, the inefficient emitted radiation has advantageous uses for imaging pore region 40 during the operation of radial memory device 20. Emissive radiation 502 generally includes, but is not limited to, the infrared region of the electromagnetic spectrum due to the nature of joule heating in a resistive body. Further, the transparency of upper insulator 30 allows emissive radiation 502 to exit radial memory device 20.

Thus, given a transparent upper insulator 30, pore region 40 may be imaged during a programming operation. Here, imaging is intended to be interpreted broadly to mean a sensing of radiation, light, and/or conditions including, but not limited to, direct visualization with a human eye, measurements by a camera to form an image, measurements by equipment to measure absolute temperature, measurements by equipment to measure relative temperature, measurements that include detection and intensity of predetermined wavelengths of electromagnetic radiation including, but no limited to, visible light and infrared.

The imaging has clear advantages in a research and development setting, as well as a design setting. Where pore region 40 is imaged, wavelength and magnitude of emissive radiation 502 may be used to determine precise operating characteristics of radial device 500. Further, where only theoretical calculations for the temperature of, or the phase state of, phase-change layer 28, a researcher has the capability to directly measure and characterize radial device 500. Further, the structure of radial device 500 may be imaged including first electrode 24, lower insulator 26, phase-change layer 28, virtual electrode 42, second electrode 29, sloped portion 50, and upper insulator 30. Thus, theory may be tested and directly verified through experimentation. Further, unknown properties and characteristics may be discovered and understood using this novel imaging and measurement technique.

Alternatively, transparent upper insulator 30 may be used to allow radial device 500 to be employed as an emissive device rather than a memory device. Indeed, emissive radiation 502 may be designed to interact with an object outside of radial device 500. Embodiments include display technologies as well as other optical applications such as read/write operations for disks. Further, transparent upper insulator 30 allows for external programming of pore region 40. Radial device 500 may now be programmed with a heat source, e.g. a laser, to provide the desired state of phase-change layer 28.

Figure 7:
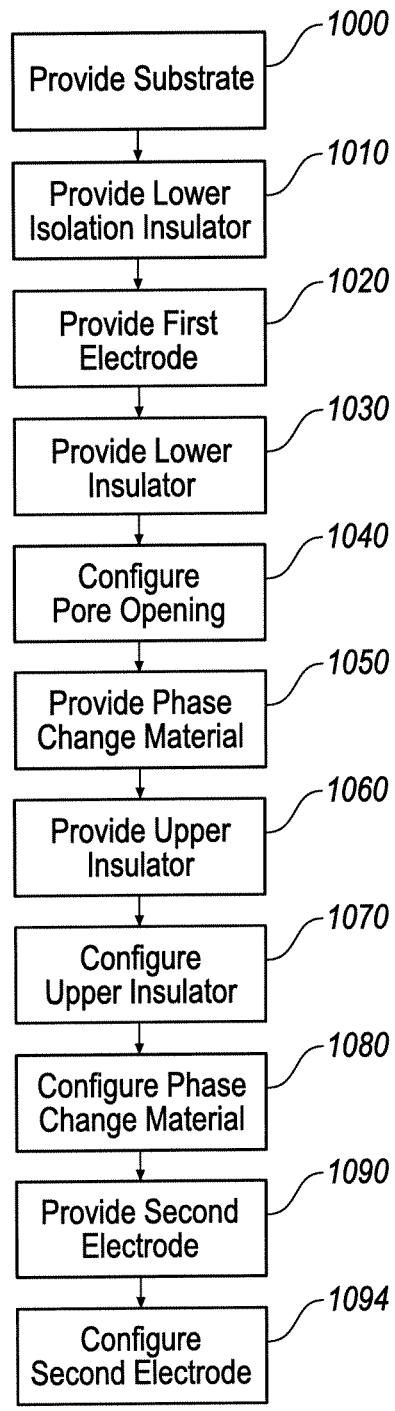
FIG. 7 is a flow diagram of the construction of the alternative embodiment of FIGS. 2A-2C.

FIG. 7 is a flow diagram of the construction of the embodiment of FIGS. 2A-2C. In step 1000, a substrate is provided for the construction of radial memory device 200. The substrate may be a glass or silicon wafer of suitable properties for constructing radial memory device 200. Further, the substrate may be a wafer including semiconductor elements where memory device 200 is to be constructed above or within the typical interconnect strata. That is to say, the substrate may already contain no circuits, partial, or complete circuits and systems that are to be used in conjunction with radial memory device 200.

Next, in step 1010 lower isolation layer 22 is provided. Lower isolation layer is typically made of $SiO_2$ (silicon dioxide) and is readily deposited by techniques such as chemical vapor deposition (CVD). As is known in the art, silicon dioxide is a common insulator in semiconductor device technology. Lower isolation layer 22 provides electrical and thermal isolation from any structures that radial memory device 200 is constructed above.

Next, in step 1020 first electrode 24 is provided. First electrode 24 is typically an aluminum deposited by sputtering or evaporation. As radial memory device 200 may be constructed between steps in a semiconductor process, first electrode 24 may be deposited along with other interconnect lines for other circuitry constructed on the substrate.

Next, in step 1030 lower insulator 26 is provided. Lower insulator 26 may also be a silicon dioxide material and is deposited by CVD.

Next, in step 1040 lower insulator 26 is configured to form pore opening 70 and sloped portion 50. In this step, a hole is etched through lower insulator 26 to expose first electrode 24 using, e.g., reactive ion etching (RIE). Because lower insulator 26 was provided as a layer in step 1030, it is necessary to remove material such that pore opening 70 is provided through lower insulator 26. Sloped portion 50 will also allow for easier filling of pore region in step 1070 as phase-change layer 28 is provided.

Next, in step 1050 phase-change layer 28 is provided. Typically GST225 is deposited in a layer. Further, phase-change layer 28 now includes differing thicknesses because of the pore opening configured having sloped portion 50. Sloped portion 50 allows for a thinner layer of phase-change-layer 28 above lower insulator 26 than is present in pore region 40. An optional carbon etch stop layer 202 may also be deposited in step 1050, wherein optional carbon etch stop layer 202 is deposited above phase-change layer 28 (shown in detail with respect to FIG. 2A).

Next, in step 1060 upper insulator 204 is provided in a capping operation for isolation of radial memory device 20 above pore opening 70. Upper insulator 204 may comprise a material such as $SiO_2$ or $Si3N_4$. In a preferred embodiment, silicon dioxide is used. Uses for an optically transparent material, such as imaging of the pore, are described in detail with respect to FIGS. 6 and 9.

Next, in step 1070, upper insulator 204 is configured as a non-conductive region above phase-change layer 28 directly above pore opening 70. As shown in FIGS. 2A and 2B, upper insulator 204 is configured as a disk directly over pore opening 70, and larger than pore region 40. However, in alternative embodiments the radial size of upper insulator 204 need not be larger than pore opening 70. The radial size of upper insulator 204, as compared to the radial size of pore opening 70, will influence the radial distance current will flow from pore opening 70 to second electrode 206, as well as the resistance therebetween.

Next, in step 1080 phase-change layer 28 is configured. Phase change layer may be configured to isolate phase-change layer 28 between adjacent radial memory devices 20. Further, phase-change layer 28 may be configured to have differing depths, trenches, or cut-outs.

Next, in step 1090 second electrode 102 is provided. Typically, second electrode 102 is metallic and is deposited by sputtering or evaporation.

Next, in step 1094 second electrode 102 is configured to separate second electrode 102 from adjacent second electrodes 102 (not shown) or to define the size of contact region 212 (shown in FIGS. 2A and 2C). Further, configuration of second electrode 102 may include forming interconnects to the supporting circuitry (i.e., read/write circuits) for radial memory device 20.

FIG. 8 is a flow diagram of the construction of the embodiment of FIGS. 3A-3D. In step 1100, a substrate is provided for the construction of radial memory device 20. The substrate may be a glass or silicon wafer of suitable properties for constructing radial memory device 20. Further, the substrate may be a wafer including semiconductor elements where memory device 20 is to be constructed above or within the typical interconnect strata. That is to say, the substrate may already contain no circuits, partial, or complete circuits and systems that are to be used in conjunction with radial memory device 20.

Next, in step 1110 lower isolation layer 22 is provided. Lower isolation layer is typically made of $SiO_2$ (silicon dioxide) and is readily deposited by techniques such as chemical vapor deposition (CVD). As is known in the art, silicon dioxide is a common insulator in semiconductor device technology. Lower isolation layer 22 provides electrical and thermal isolation from any structures that radial memory device 20 is constructed above.

Next, in step 1120 first electrode 24 is provided. First electrode 24 is typically a metal or nitrided metal, such as W, TiN, TiAlN etc deposited by sputtering or CVD deposition. As radial memory device 20 may be constructed between steps in a semiconductor process, first electrode 24 may be deposited along with other interconnect lines for other circuitry constructed on the substrate.

Next, in step 1130 lower insulator 26 is provided. Lower insulator 26 may also be a silicon dioxide material and is deposited by CVD.

Next, in step 1140 lower insulator 26 is configured to form pore opening 70 and sloped portion 50. In this step, a hole is etched through lower insulator 26 to expose first electrode 24 using, e.g., reactive ion etching (RIE). Because lower insulator 26 was provided as a layer in step 1130, it is necessary to remove material such that pore opening 70 is provided through lower insulator 26. Further, sloped portion 50 is configured using the predetermined radiuses $R_O$ and $R_f$ for the generally circular pore opening 70 as is explained in detail with respect to FIG. 4A. Sloped portion 50 will also allow for easier filling of pore region in step 1150 as phase-change layer 28 is provided.

Next, in step 1150 phase-change layer 28 is provided. Typically GST225 is deposited in a layer. Further, phase-change layer 28 now includes differing thicknesses because of the pore opening configured having sloped portion 50. Sloped portion 50 allows for a thinner layer of phase-change-layer 28 above lower insulator 26 than is present in pore region 40.

Next, in step 1160 phase-change layer 28 is configured. Phase change layer may be configured to isolate phase-change layer 28 between adjacent radial memory devices 20. Further, phase-change layer 28 may be configured to have differing depths, trenches, or cut-outs.

Next, in step 1170 second electrode 102 is provided. Typically, second electrode 102 is metallic and is deposited by sputtering or evaporation.

Next, in step 1180 second electrode 102 is configured to include an opening therethrough generally conforming pore opening 70 but having a slightly larger opening than pore opening 70. The expanded size of the opening provides for virtual electrode 42 would not otherwise be present just beyond pore region 40. Further, configuration of second electrode 102 may include forming interconnects to the supporting circuitry (i.e., read/write circuits) for radial memory device 20.

Next, in step 1190 upper insulator 30 is provided in a capping operation for isolation of radial memory device 20. Upper insulator 30 may comprise an optically transparent material such as $SiO_2$ or $Si_3N_4$. In a preferred embodiment, silicon dioxide is used. Uses for an optically transparent material, such as imaging of the pore, are described in detail with respect to FIGS. 6 and 9.

FIG. 9 is a flow diagram of the imaging of the embodiments of FIGS. 1-2 and 6-8. In step 1200, radial memory device 20 is provided and has a transparent upper insulator 30. As discussed above, transparent upper insulator 30 permits imaging of radial memory device 20.

In step 1210, radial memory device 20 is imaged. The imaging may be used for research purposes to study and/or experimentally verify theory as are described in detail above with respect to FIG. 6.

The present invention has been particularly shown and described with reference to the foregoing embodiments, which are merely illustrative of the best modes for carrying out the invention. It should be understood by those skilled in the art that various alternatives to the embodiments of the invention described herein may be employed in practicing the invention without departing from the spirit and scope of the invention as defined in the following claims. This embodiments should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

With regard to the processes, methods, heuristics, etc. described herein, it should be understood that although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes described herein are provided for illustrating certain embodiments and should in no way be construed to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. A memory element, comprising:
   a phase-change material;
   a first electrode electrically coupled to said phase-change material, said first electrode and said phase-change material forming
   a first area of contact;
   a dielectric material at least partially overlying said first area of contact; and a second electrode overlying the dielectric material and being electrically coupled to said phase change material, wherein the second electrode includes:
an annular portion that surrounds the dielectric material, wherein the annular portion is laterally spaced from the first area of contact by a lateral distance, wherein the annular portion substantially circumferentially surrounds the first area of contact.

2. The memory element of claim 1, wherein said dielectric material completely overlies said first area of contact.

3. The memory element of claim 1, wherein said phase-change material is disposed over said first electrode, wherein said dielectric material is disposed over said phase-change material.

4. The memory element of claim 1, wherein said phase-change material comprises:
a chalcogenide material.

5. The memory element of claim 1, wherein said annular portion of the second electrode further comprises:
a second area of contact between said second electrode and said phase-change material, wherein said second area of contact circumscribes said dielectric material.

6. The memory element of claim 1, wherein said second electrode overlies said first area of contact.

7. The memory element of claim 1, further comprising
a resistive material layer disposed between said phase-change material and said dielectric material.

8. The memory element of claim 7, wherein said resistive material layer overlies said first area of contact.

9. The memory element of claim 7, wherein said resistive material layer is
a carbon etch stop layer.

10. The memory element of claim 7, wherein said resistive material layer is in direct contact with said phase-change material.

11. The memory element of claim 10, wherein said resistive material layer is in direct contact with said dielectric material.

12. The memory element of claim 7, wherein said resistive material layer is in direct contact with said second electrode.

13. The memory element of claim 7, wherein a resistance of said resistive material layer is non-isotropic.

14. The memory element of claim 13, wherein the resistance of said resistive material layer in a direction parallel to said first area of contact is greater than the resistance of said resistive material layer in a direction normal to said first area of contact.

15. The memory element of claim 1, wherein the lateral distance is
a radial distance.

16. The memory element of claim 5, wherein the second area of contact is laterally spaced from first area of contact by the lateral distance.

17. The memory element of claim 5, wherein the second area of contact is vertically spaced from first area of contact by a vertical distance.

18. The memory element of claim 17, wherein the lateral distance is greater than the vertical distance.

19. The memory element of claim 17, wherein the lateral distance is at least twice as great than the vertical distance.

20. The memory element of claim 5, wherein the second area of contact completely circumscribes the first area of contact.

21. The memory element of claim 5, wherein the second area of contact nearly completely circumscribes the first area of contact.

22. The memory element of claim 1, wherein the second area of contact forms a C shape.

23. The memory element of claim 12, wherein the annular portion of said second electrode directly contacts the phase-change material.

24. The memory element of claim 23 further comprising:
an etch stop layer, wherein the annular portion of the second electrode surrounds the etch stop layer, wherein the etch stop layer overlies the phase-change material, wherein the dielectric material overlies the etch stop layer.

25. A memory element comprising:
a first electrode;
a second electrode, wherein the second electrode includes an annular portion;
a phase-change material electrically coupled to said first electrode and said second electrode, wherein said phase-change material and said first electrode forms a first area of contact, wherein said phase-change material and the annular portion of said second electrode forms a second area of contact, wherein the annular portion is laterally spaced from the first area of contact by a lateral distance, wherein the annular portion substantially circumferentially surrounds the first area of contact;
a first material disposed on top of said phase-change material; and
a dielectric material disposed on top of said first material, wherein the annular portion of the second electrode surrounds the dielectric material, wherein said first material and said dielectric material both at least partially overlie said first area of contact, wherein said first material has a lateral resistance greater than a lateral resistance of said phase-change material.

26. The memory element of claim 25, wherein said first material and said dielectric material completely overlie said first area of contact.

27. The memory element of claim 25, wherein said phase-change material comprises a chalcogenide material.

28. The memory element of claim 25, wherein said first area of contact is substantially planar.

29. The memory element of claim 25, wherein said second area of contact substantially circumscribes said first area of contact.

30. The memory element of claim 25, wherein the lateral distance is
a radial distance.

31. The memory element of claim 25, wherein the second area of contact is laterally spaced from first area of contact by the lateral distance.

32. The memory element of claim 25, wherein the second area of contact is vertically spaced from first area of contact by a vertical distance.

33. The memory element of claim 32, wherein the lateral distance is greater than the vertical distance.

34. The memory element of claim 32, wherein the lateral distance is at least twice as great than the vertical distance.

35. The memory element of claim 25, wherein the second area of contact completely circumscribes the first area of contact.

36. The memory element of claim 25, wherein the second area of contact nearly completely circumscribes the first area of contact.

37. The memory element of claim 36, wherein the second area of contact forms a C shape.

38. The memory element of claim 25, wherein the annular portion of said second electrode directly contacts the phase-change material.

39. The memory element of claim 25, wherein the annular portion of the second electrode surrounds the first material.

40. The memory element of claim 25, wherein the first material is a carbon etch stop layer.

* * * * *